United States Patent
Hourne

(10) Patent No.: US 8,570,054 B2
(45) Date of Patent: Oct. 29, 2013

(54) DEVICE FOR DETECTING A CAPACITANCE VARIATION AND CAPACITIVE SENSOR FOR DETECTING THE PRESENCE OF A USER USING SUCH A DEVICE

(75) Inventor: Xavier Hourne, Cugnaux (FR)

(73) Assignee: Valeo Securite Habitacle, Creteil (FR)

( * ) Notice: Subject to any disclaimer, the term of this patent is extended or adjusted under 35 U.S.C. 154(b) by 971 days.

(21) Appl. No.: 11/916,253

(22) PCT Filed: May 30, 2006

(86) PCT No.: PCT/EP2006/062693
§ 371 (c)(1),
(2), (4) Date: Jun. 2, 2010

(87) PCT Pub. No.: WO2006/128850
PCT Pub. Date: Dec. 7, 2006

(65) Prior Publication Data
US 2010/0231240 A1   Sep. 16, 2010

(30) Foreign Application Priority Data
Jun. 1, 2005 (FR) ...................... 05 05083

(51) Int. Cl.
*G01R 27/26* (2006.01)
(52) U.S. Cl.
CPC ................................. *G01R 27/2605* (2013.01)
USPC ......................................................... 324/686
(58) Field of Classification Search
None
See application file for complete search history.

(56) References Cited

U.S. PATENT DOCUMENTS

| | | | | |
|---|---|---|---|---|
| 4,931,737 A | * | 6/1990 | Hishiki | 324/431 |
| 5,089,783 A | | 2/1992 | Kapsokavathis et al. | |
| 5,917,165 A | * | 6/1999 | Platt et al. | 200/600 |
| 7,205,777 B2 | * | 4/2007 | Schulz et al. | 324/661 |
| 7,479,791 B2 | * | 1/2009 | Kraus | 324/678 |
| 2002/0140440 A1 | | 10/2002 | Haase | |

FOREIGN PATENT DOCUMENTS

DE  103 03 480 A1   8/2004
WO  WO 2004085970 A2 * 10/2004

OTHER PUBLICATIONS

"Capacitive Sensors" by L. K. Baxter Jul. 20, 2000.*
International Search Report for PCT/EP2006/062693 mailed Oct. 5, 2006 (3 pages).

* cited by examiner

*Primary Examiner* — Paresh Patel
(74) *Attorney, Agent, or Firm* — Osha Liang LLP

(57) ABSTRACT

A device for detecting a variation in the capacitance of a variable capacitive structure, wherein the device generates voltage pulses, charges the variable capacitive structure using the voltage pulses, discharges the variable capacitive structure toward a reference capacitor, detects a voltage threshold across the terminals of the reference capacitor, determines a number of charges and/or discharges of the variable capacitive structure corresponding to the voltage threshold, and detects a variation in the number of charges and/or discharges with respect to a number of charges and/or discharges previously obtained.

10 Claims, 2 Drawing Sheets

DEVICE FOR DETECTING A CAPACITANCE VARIATION AND CAPACITIVE SENSOR FOR DETECTING THE PRESENCE OF A USER USING SUCH A DEVICE

FIELD OF THE INVENTION

The present invention relates to the design of a device for detecting a capacitance variation of a variable capacitive structure. It is also aimed at a capacitive sensor for detecting the presence of a user, implementing such a device.

The field of the invention relates to the detection of the presence of a user, in particular in the automobile sector. Indeed, user detection devices are becoming more and more an integral part of on-board safety and control systems, and the detection of a user is considered as the wake-up of a whole system that can be put into standby mode in the absence of a user. This putting into standby of a whole system thus avoids this system consuming power for the whole time that no user is present, which contributes to a significant energy saving.

BACKGROUND OF THE INVENTION

There currently exist numerous systems for detecting the presence of a user. Systems based on optical sensors, on temperature sensors, or on electrodes and capacitive sensors may be mentioned. The systems based on capacitive sensors are based on an evaluation of the variation in the capacitance of a variable capacitive structure as a function of the presence or otherwise of one or more users.

At present, there exist charge transfer capacitive sensors such as the sensors described in the publication "CAPACITIVE SENSORS" by Larry K. Baxter, published by The Institute Of Electrical and Electronic Engineers, Inc. The sensors presented in this publication allow the variation in the capacitance of a variable capacitor C1 to be measured, thanks to a capacitor C2 known as reference capacitor. By carrying out a cycle composed of a large number of charges and discharges of the capacitor C1 into the reference capacitor C2, until a fixed voltage threshold is reached across the terminals of the reference capacitor C2, the variation in the capacitance C1 with respect to the preceding cycle can be detected by estimating the variation in the number of discharges of the capacitor C1 into the capacitor C2 that had to be carried out in order to reach the voltage threshold across the terminals of C2.

These sensors involve using a switching component we that allows the current to be directed so as to firstly charge up the capacitor C1 and then discharge the capacitor C1 into the capacitor C2 and vice versa. However, this switching component is an element that is difficult to manufacture and whose manufacture is very costly.

A technical problem is therefore posed for the construction of a current-reversing circuit such that the circuit can go from a circuit for charging a variable capacitive structure, whose capacitance variation it is desired to detect, to a circuit for discharging this capacitive structure.

In the following, 'variable capacitive structure' is understood to mean any hardware configuration formed by a capacitive electrode integrated into an object or into a system and via its near environment connected directly or indirectly to a ground reference, this environment being able to include a part of the body of a user whose presence must be detected.

SUMMARY OF THE INVENTION

The invention aims to overcome the aforementioned problems with a device for detecting a variation in the capacitance of a variable capacitive structure, comprising:

means for generating voltage pulses,
means for charging the variable capacitive structure by means of said voltage pulses,
means for discharging said variable capacitive structure toward a reference capacitor,
means for detecting a voltage threshold across the terminals of the reference capacitor,
means for determining a number of charges and/or discharges of said variable capacitive structure corresponding to said voltage threshold, and
means for detecting a variation in said number of charges and/or discharges with respect to a number of charges and/or discharges previously obtained.

The detection device according to the invention constitutes an innovative approach in the detection of the variation of the capacitance of a variable capacitive structure, since the electrical circuit implemented for providing the charge and the discharge of the variable capacitive structure is very simple and can be manufactured with low-cost elements.

There is no physical switching between the circuit for charging and for discharging the capacitor which advantageously avoids an element such as a switch having to be used to perform such an operation. Indeed, this circuit is configured to provide a unidirectional transfer of energy from the variable capacitive structure toward the reference capacitor, which allows the charge of the variable capacitive structure Cx, whose capacitance variation is to be measured, to be separated from its discharge and a complete discharge of the variable capacitive structure toward the reference capacitor Cs to thus be ensured. This thus avoids a part of the energy contained in the variable capacitive structure returning toward the pulse generation means and being taken into account in the detection of the capacitance variation of the variable capacitive structure Cx.

Such a transfer of energy is advantageously carried out by a component that only permits a unidirectional transfer of the current. Such a component can be a diode D1 or any other element able to fulfill such a role. Thus, since it is placed in series between the pulse generation means and the other means forming part of the device according to the invention, the diode D1 allows the current to flow from the pulse generation means toward the variable capacitive structure Cx during the charge of the variable capacitive structure Cx. During the discharge of the variable capacitive structure Cx, it prevents the current from returning toward the pulse generation means or any means other than the reference capacitor Cs. Thus, the diode D1 allows the discharge of the variable capacitive structure Cx to be channeled toward the reference capacitor Cs.

Since the operation for switching over from the charge circuit to the discharge circuit and vice versa is an operation carried out a very large number of times in the course of the detection of the variation in the capacitance, the fact that such an operation is replaced by an element such as a diode D1 advantageously simplifies the control of such a circuit.

The voltage pulses required to charge up the variable capacitive structure Cx, whose capacitance variation it is desired to measure, can be advantageously formed any voltage generator, such as a clock whose pulses have a duration that is sufficiently long to allow the variable capacitive structure to completely charge up. In addition, the duration of the pulses must not be too long so as to charge up the reference capacitor Cs, which would then in the end risk falsifying the detection of the variation. In this way, the production of the pulses is advantageously effected by a clock circuit that is simple and of limited size that will easily be able to be integrated into a system.

For the production of the voltage pulses of a duration adapted to the total charge up of the capacitor, a generator including clock circuit delivering a square-wave signal, followed by a high-pass filter, may also be used. In this way, the square-wave signal at the output of the clock is injected into the high-pass filter and transformed into pulses by the high-pass filter. It will need to be ensured that the clock and the high-pass filter have characteristics (period, amplitude, etc.) adapted so as to generate voltage pulses long enough to charge up the variable capacitive structure Cx and short enough so as not to charge up the reference capacitor Cs, which must mainly be charged by the discharges of the variable capacitive structure Cx.

The means for discharging the variable capacitive structure Cx can advantageously comprise a resistor Rs. This resistor Rs, placed in parallel with the variable capacitive structure Cx, downstream of the diode D1 and upstream of the reference capacitor Cs, allows the discharging of the variable capacitive structure Cx to be controlled. Thus, this resistor allows the time constant T1=Rs*Cx, which must be greater than the duration of the pulses generated by the pulse generation means, to be controlled.

The device according to the invention also comprises means for detecting a voltage threshold across the terminals of the reference capacitor Cs. These means comprise a comparator C. Thus, after multiple discharges of the variable capacitive structure Cx, whose capacitance variation is to be measured, into the reference capacitor Cs, the voltage across the terminals of the capacitor increases and reaches a voltage threshold.

The device according to the invention also comprises means that make it possible to determine the number N of discharges that have allowed the fixed voltage threshold across the terminals of the reference capacitor Cs to be reached. These means comprise a counter allowing the number of charges and/or discharges and/or the number of pulses generated by the pulse generation means to be counted.

It is useful to point out that the reference capacitor Cs is such that the variable capacitive structure Cx can be discharged a large number of times into Cs, which assumes that the reference capacitor Cs is of higher capacitance than Cx.

Thus, the number N(t) of times that the variable capacitive structure Cx has been discharged into the reference capacitor Cs, in order for the voltage across the terminals of the reference capacitor Cs to reach a fixed voltage threshold, can be enumerated.

The device according to the invention advantageously comprises means for detecting a variation in the number N(t) of charges and/or discharges of the variable capacitive structure Cx corresponding to the fixed voltage threshold across the terminals of the reference capacitor Cs with respect to a number N(t−1) previously obtained. These means comprise an ECU.

The variation in the number of discharges, from the variable capacitive structure Cx into the reference capacitor Cs, corresponding to a voltage threshold across the terminals of the reference capacitor Cs, is directly linked to the variation in the capacitance of Cx. Thus, the variation in the capacitance of Cx can be detected.

Once the detection operations are finished, the reference capacitor can be discharged by means of a switch SW1, in order to allow a new detection phase.

One non-limiting example of the device according to the invention may be the detection of the variation in the capacitance between a detection electrode disposed within a piece of equipment and the environment of the electrode. One such electrode E is shown in FIG. 2. The electrode E is the plate of the capacitive structure Cx that is linked to the circuit. Accordingly, the variable capacitive structure Cx will then be the capacitance formed, on the one hand, by the detection electrode and, on the other, by its environment. The environment of the detection electrode may then be a wall, a human presence, a car, or any other real-life object. This electrode may be incorporated into a car door handle in order to serve as a device for detecting the presence of a user. The detection device may advantageously be integrated into the handle.

BRIEF DESCRIPTION OF THE DRAWINGS

Other advantages and features will become apparent upon examining the detailed description of one non-limiting embodiment and the appended drawings, in which.

DETAILED DESCRIPTION

One non-limiting embodiment of a device for detecting a capacitance variation according to the invention relates to a presence detection system disposed in a car door handle.

An electrode is placed in the door handle of a car. This electrode and its environment represent the variable capacitive structure Cx whose capacitance variation is to be determined. The device according to the invention, also disposed in the door handle, allows the variation in the capacitance between the electrode and its environment to be measured. The environment of the electrode is composed of any object or living being near to the car and the car itself.

Figure 1:
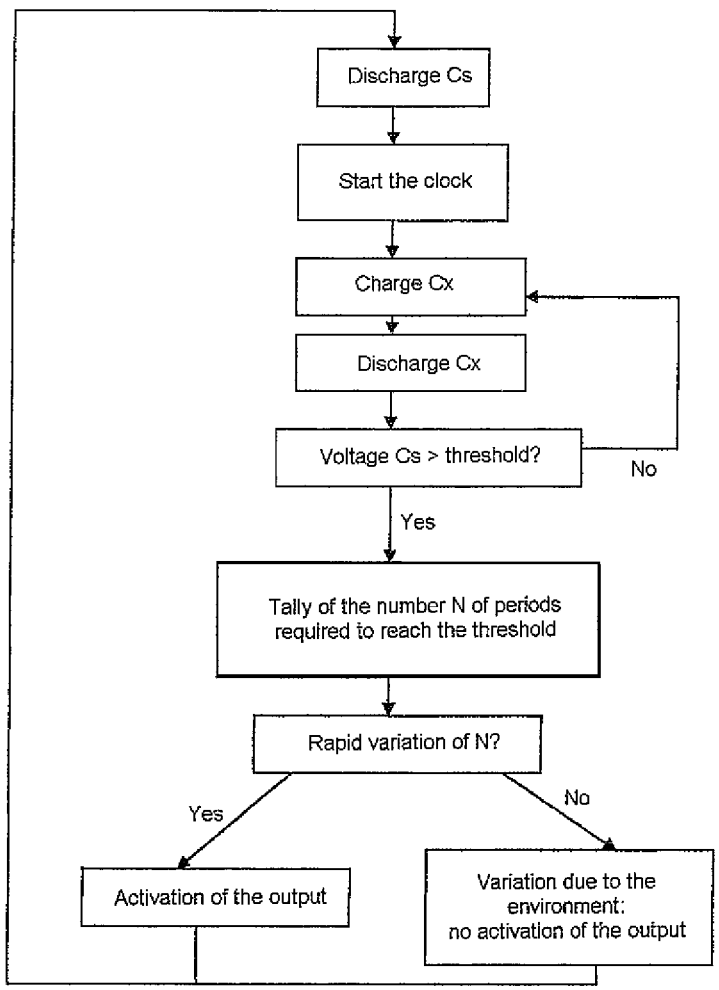
FIG. 1 illustrates one mode of operation of a presence detection system implementing the device according to the invention.

The capacitance variation of the capacitive structure Cx between the electrode and its environment is measured at each moment in time according to the mode of operation presented in FIG. 1. As soon as a rapid variation of the capacitance is detected, an activation of the output signals of the presence detection system is generated.

The variation in the capacitance is measured by the device according to the invention via a quantity which is the number N of clock periods required in order to reach a voltage threshold across the terminals of a reference capacitor Cs.

There may however be a slow variation in the capacitance due to the temperature and humidity conditions, together with all other factors having nothing to do with the presence of a potential user. It is therefore important to differentiate these variations from those caused by a potential user. This is the reason why the variation in the capacitance is considered in reference to the value N measured at the preceding moment in time. In this way, the slow variations in the capacitance Cx due to the environment and to the electrode are taken into consideration.

Figure 2:
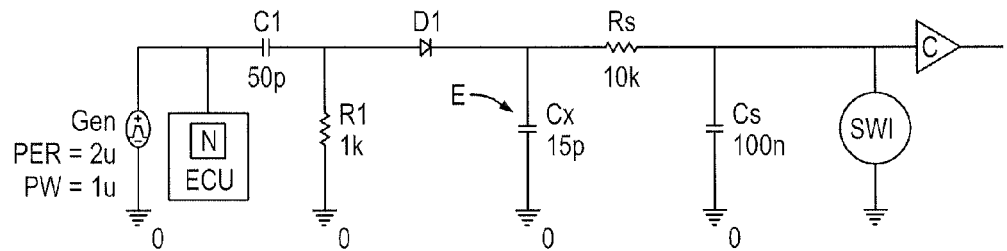
FIG. 2 shows one embodiment of a detection device according to the invention.
Figure 3:
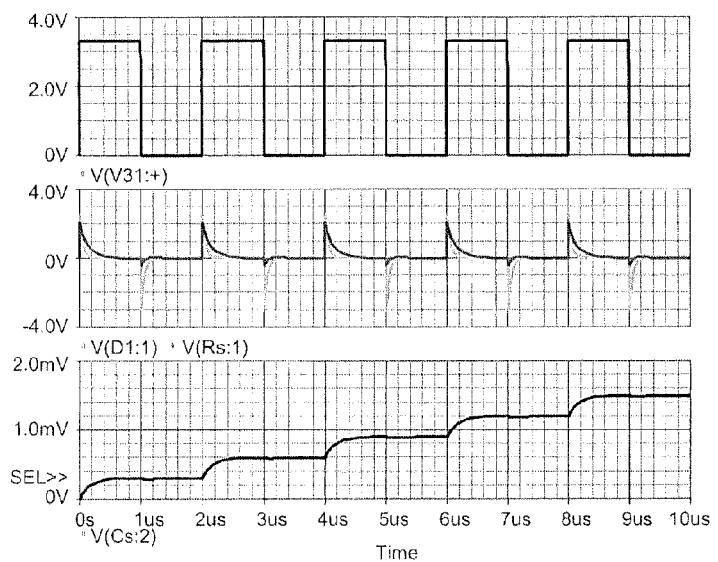
FIG. 3 shows timing diagrams of characteristic signals of the detection device according to the invention.

FIG. 2 shows one particular embodiment of an electronic circuit for charging and discharging the variable capacitive structure Cx, implemented in a detection device according to the invention, whereas FIG. 3 shows the time variation of various signals observed in this circuit: the clock signal, the voltage pulses, the voltage across the terminals of the variable capacitive structure Cx and the voltage across the terminals of the reference capacitor Cs. The reference capacitor Cs is progressively charged up as the variable capacitive structure is being charged and discharged with the pulses generated by a clock associated with a high-pass filter. This circuit allows the reference capacitor Cs to be charged with discharges of the variable capacitive structure Cx. Once the fixed voltage threshold across the terminals of Cs is reached, the number N of clock periods that have allowed this voltage threshold to be reached are tallied. The number N is compared with its previously obtained value. If there is a slow variation in the value N, this means that there is no user present near to the car and therefore the operation is repeated. The value of N is recorded in order to carry out a comparison with the value of N that will be obtained in the following step. If there is a rapid variation of the value of N, then this means that a potential user is present near to the car handle. An output signal is then emitted in order to trigger the following operations.

Such a system for detecting the presence of a user using the device according to the invention advantageously allows the wall effect during the opening of the car door to be avoided. Indeed, since the capacitance variation detection system is able to very quickly detect variations of the order of 1%, it allows the approach of a user and hence the opening of the door to be pre-empted before the handle is operated.

The detection device according to the invention is not limited to the embodiment and to the application that have just been described, and may be implemented in other applications. It could notably replace push-button switches, for example the push-button for switching on the ceiling-panel light in a car, which would allow the ceiling-panel light to come on without the user having needed to turn his attention to look for the exact location of the push-button switch.

The invention claimed is:

1. A user presence detection device, integrated in a motor vehicle, for detecting a variation in the capacitance of a variable capacitive structure (Cx), comprising:
    a generator for generating voltage pulses;
    a capacitor for charging the variable capacitive structure by means of said voltage pulses;
    a resistor for discharging said variable capacitive structure toward a reference capacitor;
    a comparator for detecting a voltage threshold across the terminals of the reference capacitor;
    a counter for determining a number of charges and discharges of said variable capacitive structure corresponding to said voltage threshold; and
    an ECU for detecting a variation in said number of charges and discharges with respect to a number of charges and discharges previously obtained.

2. The device as claimed in claim 1, further comprising:
    a diode for providing a unidirectional transfer of energy from the variable capacitive structure toward the reference capacitor.

3. The device as claimed in claim 1, wherein the pulse generation is performed using a clock.

4. The device as claimed in claim 1, wherein the pulse generation is performed using a high-pass filter.

5. The device as claimed in claim 1, wherein the resistor has a value such that the time constant is greater than a duration of the voltage pulses and less than a half-period of the pulses.

6. The device as claimed in claim 1, wherein the reference capacitor has a higher capacitance than that of the variable capacitive structure.

7. The device as claimed in claim 1, further comprising:
    a switch, controlled for discharging the reference capacitor, once the voltage across the terminals of the reference capacitor has reached a predetermined voltage threshold.

8. A capacitive sensor for detecting the presence of a user of a piece of equipment, implementing a detection device as claimed in claim 1, wherein the capacitive structure whose capacitance variation is detected comprises a detection electrode disposed within said piece of equipment, wherein the capacitance of the capacitive structure is determined between said detection electrode and an environment near said detection electrode.

9. The capacitive structure as claimed in claim 8, wherein a door handle of a vehicle is present at the piece of equipment within which the detection electrode is disposed.

10. The capacitive structure as claimed in claim 9, wherein the detection device as claimed in claim 1 is integrated into the door handle.

* * * * *